(12) United States Patent
Yu et al.

(10) Patent No.: US 7,663,213 B2
(45) Date of Patent: Feb. 16, 2010

(54) WAFER LEVEL CHIP SIZE PACKAGED CHIP DEVICE WITH A DOUBLE-LAYER LEAD STRUCTURE AND METHOD OF FABRICATING THE SAME

(75) Inventors: Guoqing Yu, SuZhou Industrial Park (CN); Youjun Wang, SuZhou Industrial Park (CN); Qinqin Xu, SuZhou Industrial Park (CN); Qingwei Wang, SuZhou Industrial Park (CN); Wei Wang, SuZhou Industrial Park (CN)

(73) Assignee: China Wafer Level CSP Ltd., Suzhou Industrial Park (CN)

( * ) Notice: Subject to any disclaimer, the term of this patent is extended or adjusted under 35 U.S.C. 154(b) by 541 days.

(21) Appl. No.: 11/559,157

(22) Filed: Nov. 13, 2006

(65) Prior Publication Data
US 2008/0111223 A1     May 15, 2008

(51) Int. Cl.
*H01L 21/58* (2006.01)
(52) U.S. Cl. ............... 257/678; 257/690; 257/E21.499; 257/E23.18
(58) Field of Classification Search ................. 257/678, 257/701, 690, E21.499, E23.18; 438/106, 438/123
See application file for complete search history.

(56) References Cited

U.S. PATENT DOCUMENTS

| | | | |
|---|---|---|---|
| 6,646,289 B1 | 11/2003 | Badehi | 257/81 |
| 6,777,767 B2 | 8/2004 | Badehi | 257/432 |
| 6,972,480 B2 | 12/2005 | Zilber et al. | 257/678 |

*Primary Examiner*—Roy K Potter
(74) *Attorney, Agent, or Firm*—Allen, Dyer, Doppelt, Milbrath & Gilchrist, P.A., Attorneys at Law

(57) ABSTRACT

The present invention disclosed a wafer level chip size packaged chip device with a double-layer lead structure and methods of fabricating the same. The double-layer lead is designed to meet a tendency of increasing quantity per area of peripheral arrayed compatible pads on a semiconductor chip, and also to save more space for layout of lead on the chip bottom surface for avoiding potential short inbetween which happen in increasing probability with increasing quantity per area on the condition of one-layer lead.

7 Claims, 11 Drawing Sheets

WAFER LEVEL CHIP SIZE PACKAGED CHIP DEVICE WITH A DOUBLE-LAYER LEAD STRUCTURE AND METHOD OF FABRICATING THE SAME

FIELD OF THE INVENTION

The present invention relates generally to a wafer level chip size packaging technology, and more particularly to a wafer level chip size packaged chip device with a double-layer lead package structure rather than a one-layer external lead package structure in standard Shellcase type wafer level chip size packaging technology, and to methods for the manufacture thereof.

BACKGROUND OF THE INVENTION

With the miniaturization of electronic devices and increasing circuit density in semiconductor industry, chip size package (CSP) is developed, where the package size is similar to the semiconductor chip encased within the package. Conventional packaging technologies, wire bonding, tape automatic bonding (TAB) and flip chip, have their own disadvantages. In wire bonding and TAB, a semiconductor package has a footprint much larger than that of the primitive chip. Flip chip package involves a direct electrical connection of face down electronic components onto substrates/carriers via conductive solder balls/bumps of the chip. The flip-chip package encounters a problem, namely, cracking of solder ball joint due to large thermal expansion mismatch between a wafer and a substrate. Chip size package is manufactured either in the form of individual chips diced from a wafer, or in a wafer form and then the individual chip size packages are singulated from the wafer. The latter is referred to as a wafer level chip size package (hereinafter WLCSP). For WLCSP, generally a plurality of compatible pads formed in a peripheral arrayed type on semiconductor chips are redistributed through conventional redistribution processes involving a redistribution layer into a plurality of metal pads, sometimes called solder bumps, in an area array type. The solder bumps on a WLCSP surface are much larger in diameter and much farer inbetween, and the printed circuit board assembly of a WLCSP is more robust. This kind of WLCSP technique has superior electrical performance and lower manufacturing costs than other packaging types, so it will play an important role in the production of future electronics.

Shellcase Co. Israel developed its unique and advanced WLCSP technology, classified ShellOP, ShellOC, and ShellUT, to package optical and image sensors, e.g., charge-coupled devices (CCD) and/or CMOS imagers integrated on a silicon wafer. Currently, CCD and CMOS imagers are explosively used in electronic products. Unlike many packaging methods, the Shellcase process requires no lead frames, or wire bonding. Briefly, ShellOP utilizes a glass/silicon/glass sandwich structure to enable image-sensing capabilities through the actual packaging structure and to protect the sensors from being contaminated by external environment. ShellOC adopts the same sandwich structure, but extra cavities are configured on a first glass which is bonded to a silicon wafer with integrated circuits on for accommodating the above imagers. Also, cavities enable the use of micro-lenses for enhanced image quality. ShellOC is thus the packaging solution of choice for image sensors with micro-lenses. In the ShellUT package, cavities are still kept but a second glass is removed so that the associated package height is reduced. It is expected that ShellUT package should be a mainstream technology among Shellcase type packaging technology in the future. U.S. Pat. Nos. 6,646,289, 6,777,767 and 6,972,480 are considered to be relevant.

FIG. 1 is a typical cross-section of prior art ShellOC packaged chip device with a one-layer lead structure and T-shape junction thereof. As shown in FIG. 1, a first/top glass 5 with cavity walls 10 thereon covers compatible pads 15 furnished silicon chip 20. An epoxy 25 is used to bond a second/bottom glass 30 to the chip 20 on which a portion of compatible pads have been exposed before by means of photolithography and plasma etching techniques. After a barrier solder mask 35 is coated on the glass 30, notching is performed so that inverted leads 40, via sputtering deposition, connect electrically to the compatible pads 15 in the form of so-called T-shape junction as marked by circle. The leads 40 are coated with a protective solder mask 45 thereon. The solder-mask 45 is a dielectric material that electrically isolates the leads 40 from external contact, and protects the lead surface against corrosion. Solder bumps 50 are attached to the bottom end of leads 45, and are suitable for printed circuit board (PCB) mounting by known methods. Solder bumps 50 may be formed by known methods such as screen printing, and may be suitably shaped for PCB mounted.

In the foregoing Shellcase type WLCSP technology, a one-layer lead is only incorporated in a whole package process, therefore, the quantity of per area of compatible pads is limited due to limited space for layout of lead on the chip bottom surface.

SUMMARY OF THE INVENTION

The present invention is intended to improve the quantity of per area of compatible pads and the electrical connection in wafer level chip size packaging technology.

In accordance with one embodiment of the present invention, a wafer level chip size packaged chip device with a double-layer lead structure comprises:

a substrate having formed thereon a silicon chip, with a plurality of compatible pads disposed at the periphery of said chip on said substrate;

a first glass disposed above said chip and said substrate;

a layer of insulating material disposed at the back of said substrate;

a first metal layer disposed at the back of said layer of insulating material, with a through hole at the center of said first metal layer;

a first solder mask disposed at the back of said first metal layer, with at least one opening on said first solder mask so as to enable part of said first metal layer exposed through said opening of said first solder mask;

a patterned second metal layer disposed at the sides of said chip device and on the back of said first solder mask;

a plurality of solder bumps each attached to a bottom end of said second metal layer so as to enable electrical connection between said compatible pads and said solder bumps via said second metal layer and said first metal layer.

In accordance with another embodiment, a cavity is formed between said substrate and said first glass so as to receive therein said chip on said substrate.

In accordance with another embodiment, a second glass is disposed between said layer of insulating material and said first metal layer.

Alternatively, a third solder mask is disposed between said second glass and said first metal layer, acting as a stress buffer and enhance adhesion of said first metal layer.

Wherein, said packaged chip device has T-shape junction between said compatible pads and said second metal layer, and has L-shape and U-shape junction between said first metal layer and said second metal layer, such that, each of said compatible pads is electrically connected with a solder bump via T-, L-, U-shape junctions.

Alternatively, said packaged chip device has T-shape junction between said compatible pads and said second metal layer, and has T-shape and 2U-shape junctions between said first metal layer and said second metal layer, such that, each of said compatible pads is electrically connected with a solder bump via 2T-, 2U-shape junctions.

The present invention further provides a method for fabricating the wafer level chip size packaged chip device with a double-layer lead structure, comprising following steps:

providing a wafer, which has plurality of substrates having formed thereon a silicon chip, with plurality of compatible pads disposed at the periphery of said chip on said substrate;

disposing a first glass above said chip and said substrate;

disposing a layer of insulating material at the back of said substrate;

disposing a first metal layer at the back of said layer of insulating material, with a through hole at the center of said first metal layer;

disposing a first solder mask at the back of said first metal layer, with at least one opening on said first solder mask so as to enable part of said first metal layer exposed through said opening of said first solder mask;

disposing a second metal layer at the sides of said chip device and on the back of said first solder mask;

patterning said second metal layer, leaving enough space for layout of parts of said second metal layer;

disposing plurality of solder bumps each attached to a bottom end of said second metal layer so as to enable electrical connection between said compatible pads and said solder bumps via said second metal layer and said first metal layer;

cutting said wafer so as to form individual chip size packaged chip device.

With such a double-layer lead, it is possible to realize application of considerable quantity per area of peripheral arrayed compatible pads on the silicon chip, improvement of electrical connection, and layout of lead on the chip bottom surface due to more space available.

DETAILED DESCRIPTION

Figure 1:
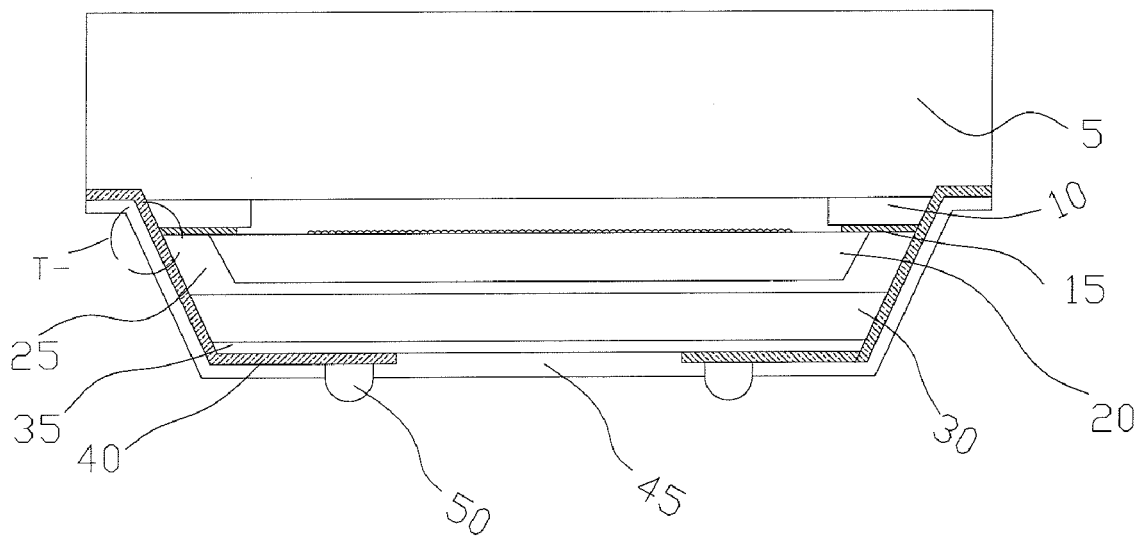
FIG. 1 is a typical cross-section of prior art ShellOC packaged chip device with a one-layer lead structure and T-shape junction thereof.

It should be pointed out that all figures in the invention are not drawn in a right proportion. Wherever possible, the same reference numbers are used in the drawings and the description to refer to the same or like parts.

We follow a whole package process flow, although some process steps of which are exactly the same as that of the standard Shellcase packaging technology, to present the current invention. In this way, it will help one to understand the present invention well. Still, the difference between the invention and the standard Shellcase packaging technology will be stressed therein.

Embodiment 1

Figure 2A:
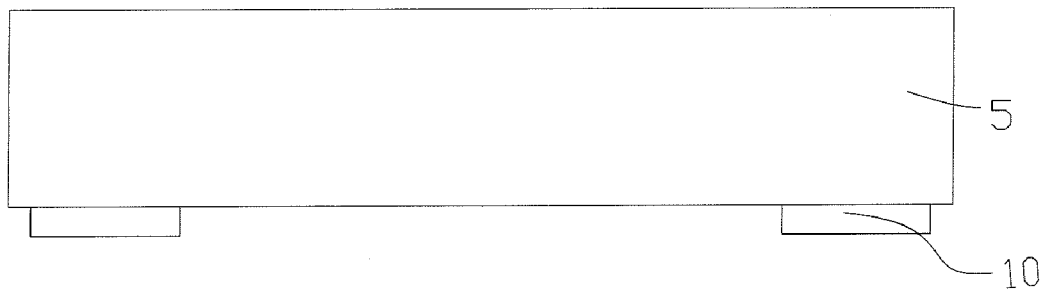
FIGS. 2A to 2L show the schematic package process flow for fabricating the ShellOC packaged chip device with a double-layer lead structure and T-, L-, U-shape junctions thereof according to embodiment 1 of the present invention.
Figure 2B:
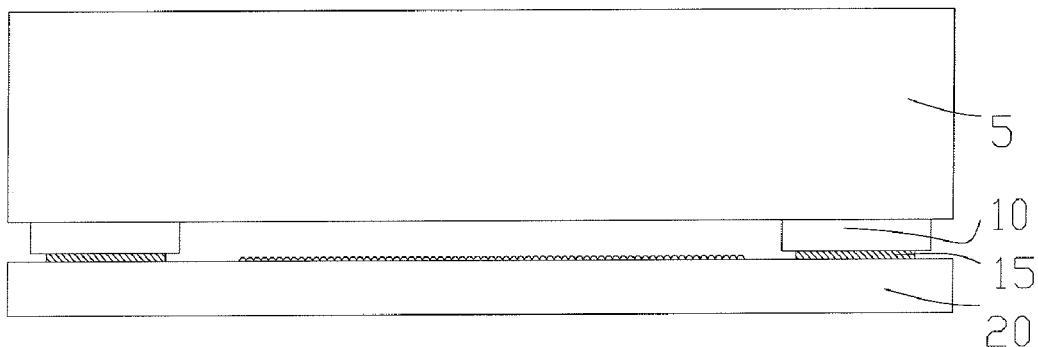
Figure 2C:
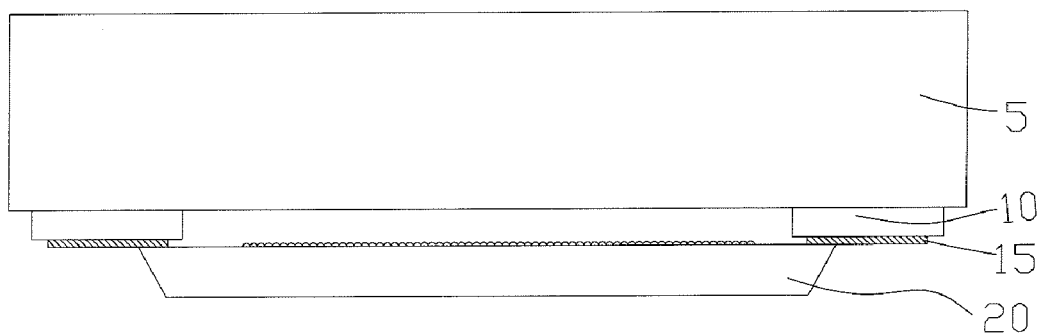
Figure 2D:
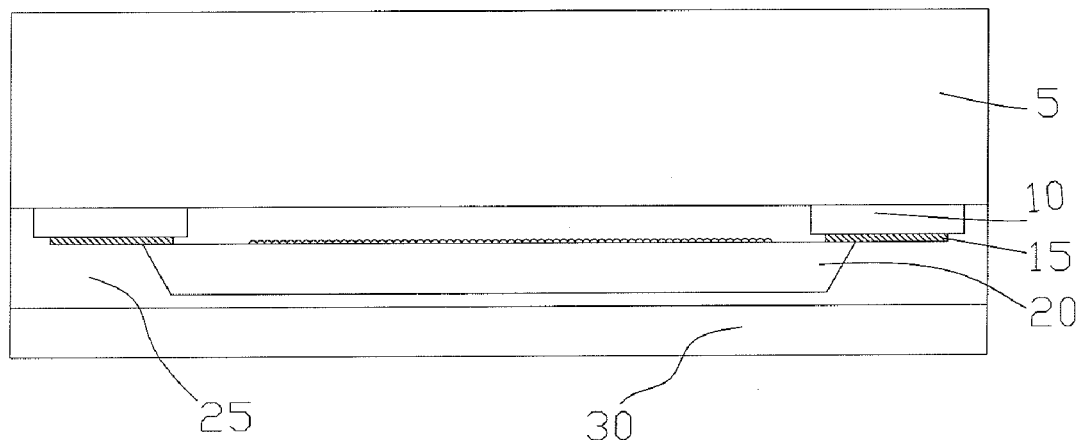
Figure 2E:
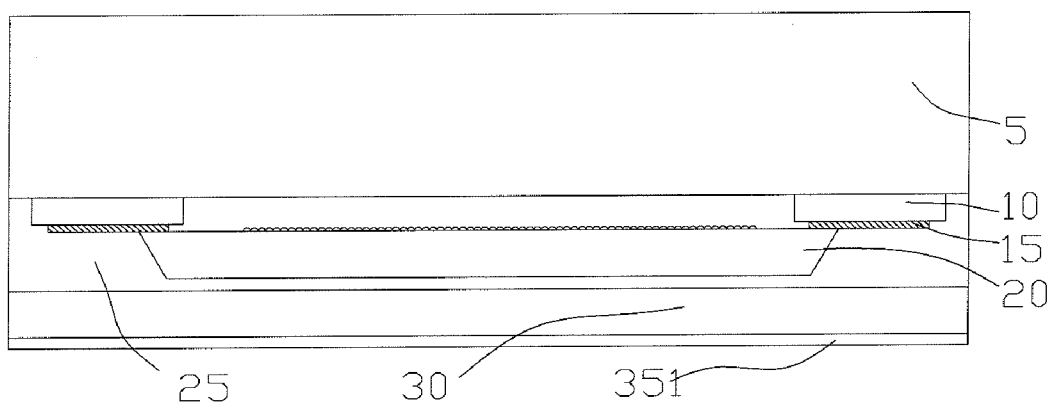
Figure 2F:
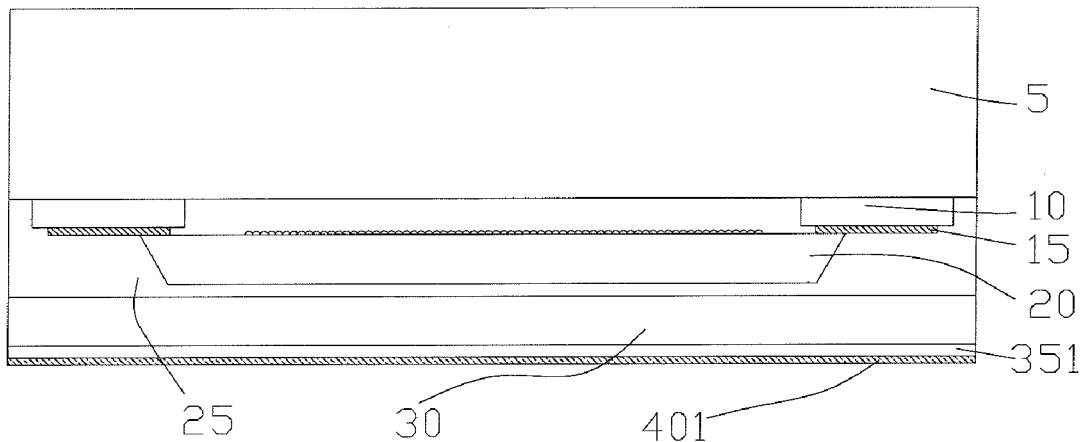
Figure 2G:
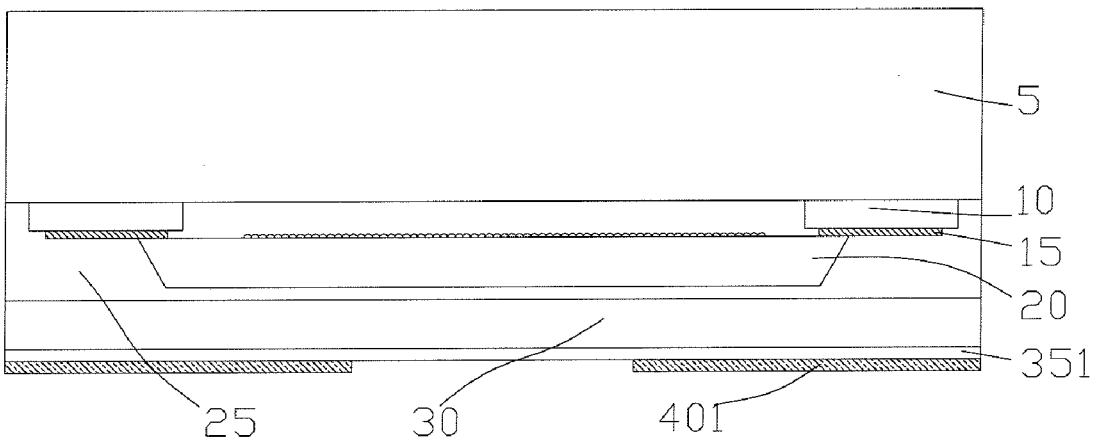
Figure 2H:
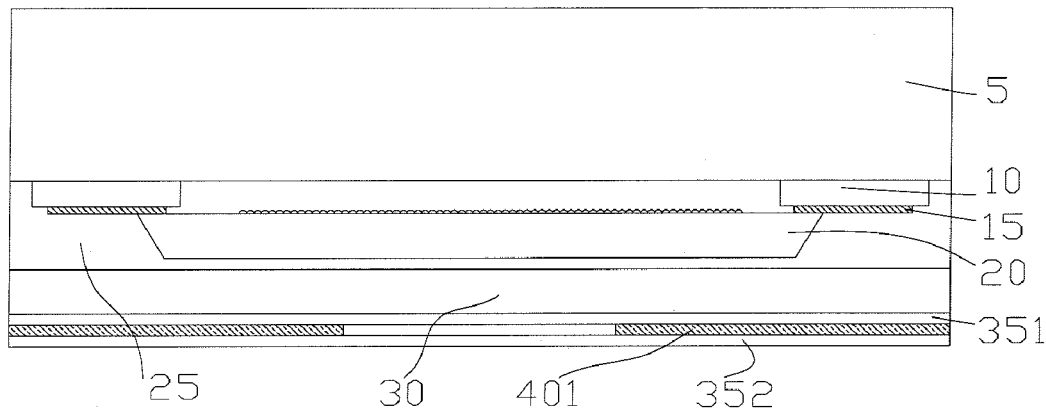
Figure 2I:
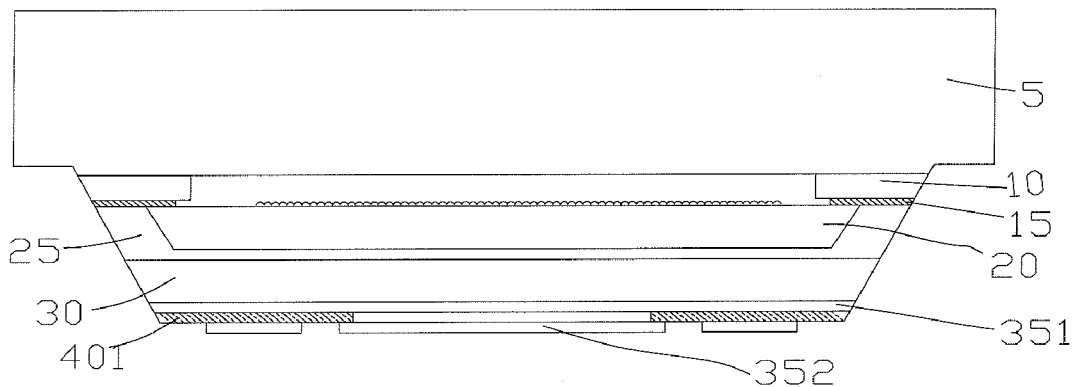
Figure 2J:
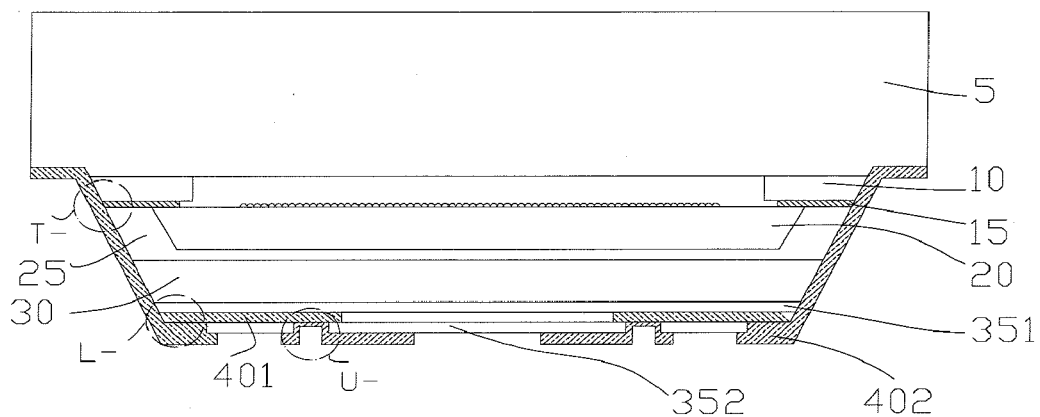
Figure 2K:
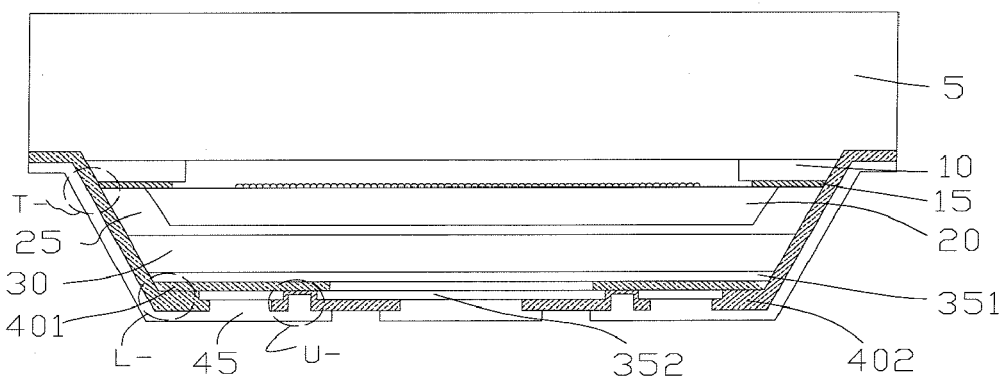
Figure 2L:
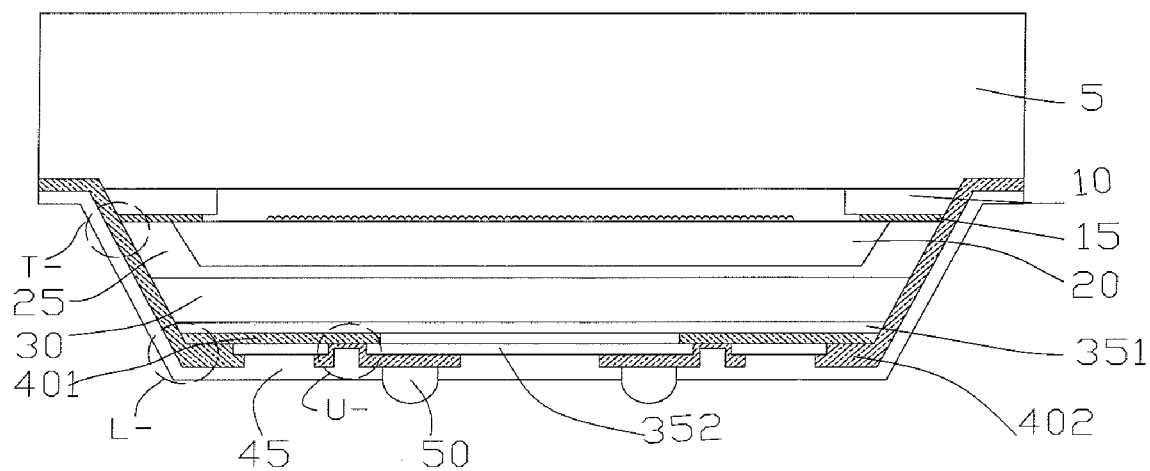

According to embodiment 1 of the present invention, ShellOC packaged chip device with a double-layer lead structure has T-, L-, U-shape junctions. As shown in FIGS. 2A to 2L, the package process flow for fabricating the same are as follows: on a first glass 5, cavity walls 10, are formed by means of photolithography technique (FIG. 2A). With the aid of a high-temperature epoxy, the glass 5 with cavity walls 10 formed thereon is applied to cover the silicon chip 20 with optical or image sensors at its center and peripheral arrayed compatible pads 15 on (FIG. 2B), wherein an optical or imaging component (as shadowed at the center) is encased within a cavity, thereby preventing the optical/imaging component from being contaminated by outside environment. Following this, the chip 20 is first thinned at its non-active surface by using mechanical grinding and plasma technique in sequence, and further selectively etched by means of photolithography and plasma techniques, thus a portion of compatible pads 15 (FIG. 2C) being exposed through trench formation therein. An insulating material 25, e.g., epoxy, is employed to fully fill the trench and therefore covers the silicon slope and the exposed compatible pads 15. Afterwards, a second glass 30 is bonded to the silicon chip 20 (FIG. 2D). Until now, a so-called glass/silicon/glass doubly bonded sandwich structure has been produced in the terms of ShellOC technology. As a mechanical buffer layer for later notching, an insulating material 351, solder mask, is coated on the glass 30 (FIG. 2E). Next, metal deposition 401 instead of notching in the standard process flow is conducted with sputtering deposition technique (FIG. 2F). Following this metal layer deposition, openings are constructed on the metal layer 401 through photolithography (FIG. 2G). Thereafter, a light sensitive solder mask 352 is coated onto the openings-formed metal layer 401, where the metal layer is split and isolated by the openings filled with the solder mask 352 (FIG. 2H). The solder mask 352 is processed to make through photolithography predetermined openings, thereby exposing a portion of the metal layer 401 (FIG. 2I). Notching is executed along scribe lines so that the lateral side of compatible pads 15 are exposed and V-shape trenches are formed (FIG. 2I). Then, a second metal layer 402 is, again through sputtering technique, deposited on the solder mask 352 with the openings and the V-shape trenches such that the compatible pads 15 and the first metal 401 are both electrically connected to the second metal layer 402 (FIG. 2J). Note that the second metal layer 402 is further patterned through lithography technique, leaving enough space for layout of parts of the second metal layer 402 which only directly electrically connect to the compatible pads 15 as in standard Shellcase type packaging process (see FIG. 1). Up to now, a so-called double-layer lead package structure has been constructed. In other words, by rerouting and redistribution of electrical connection lead via the above double-layer lead structure, some compatible pads 15 directly electrically connects along the notching edge surface to the end terminal of the second metal layer 402 whereas the rest of compatible pads 15 does via the first metal layer 401.

One may notice that the latter electrical connection is realized through T-, L-, and U-shape junctions in sequence as marked by circle. We might as well call it the double-layer lead structure with T-, L-, U-shape junctions. Obviously, the reliability of electrical connection with this structure is better than that of FIG. 1. For the following package steps, as in standard Shellcase type process, formation of under ball metallurgy on the second metal 402, coating solder mask 45, and BGA 50 printing are carried out in turn.

Wherein the glass 5 is transmissive for light; the thermal expansion coefficient of the glass 5 and the glass 30 are preferred to be similar to that of the material of the chip; both of solder mask 351 and 352 are heat resistant; the metal layer is made of but not limited to Aluminium.

Embodiment 2

Figure 3:
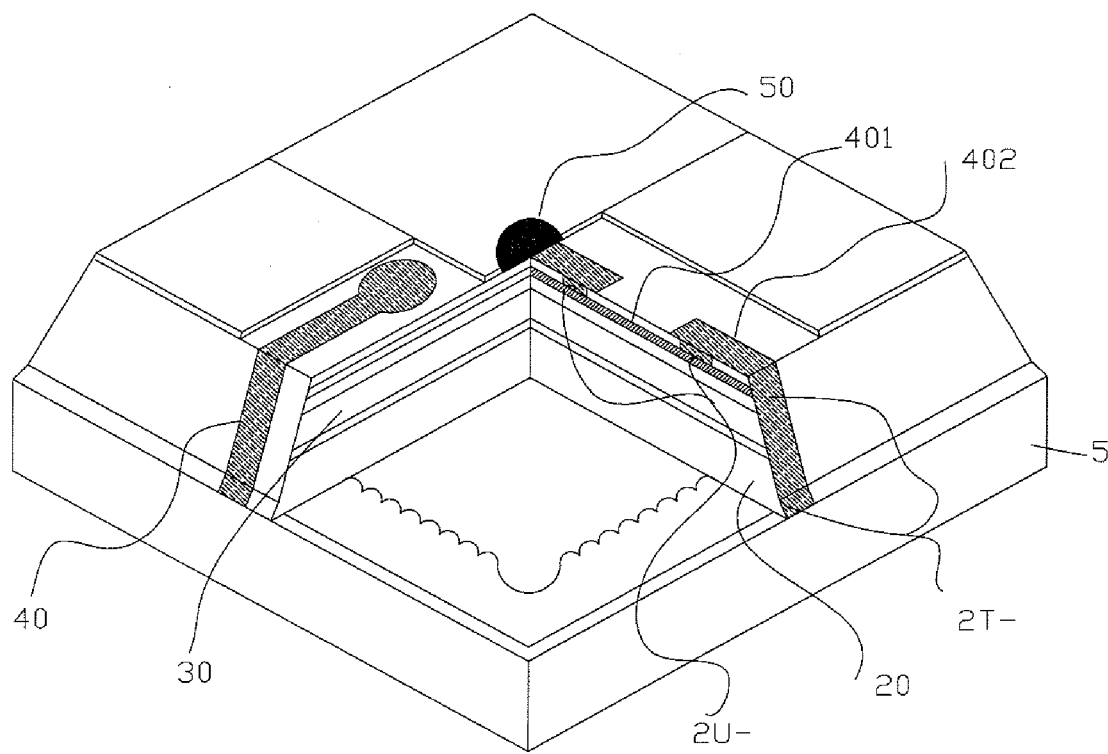
FIG. 3 is a three-dimension cross-section of the ShellOC packaged chip device with a double-layer lead structure and 2T-, 2U-shape junctions thereof according to embodiment 2 of the present invention.

To further improve electrical connection reliability, the ShellOC packaged chip device has a double-layer lead structure and 2T-, 2U-shape junctions thereof as shown in FIG. 3.

Figure 4A:
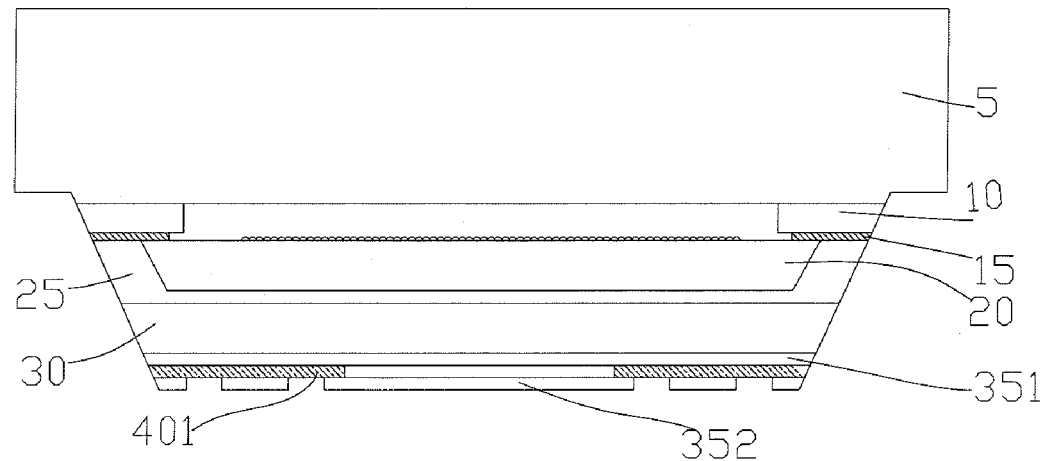
FIGS. 4A to 4D show the schematic package process flow for fabricating the ShellOC packaged chip device as shown in FIG. 3.
Figure 4B:
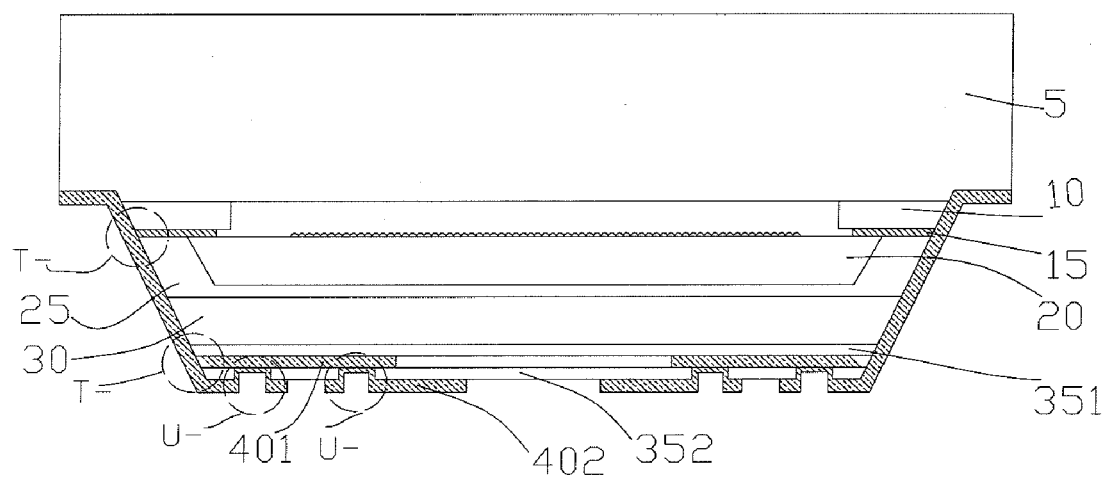
Figure 4C:
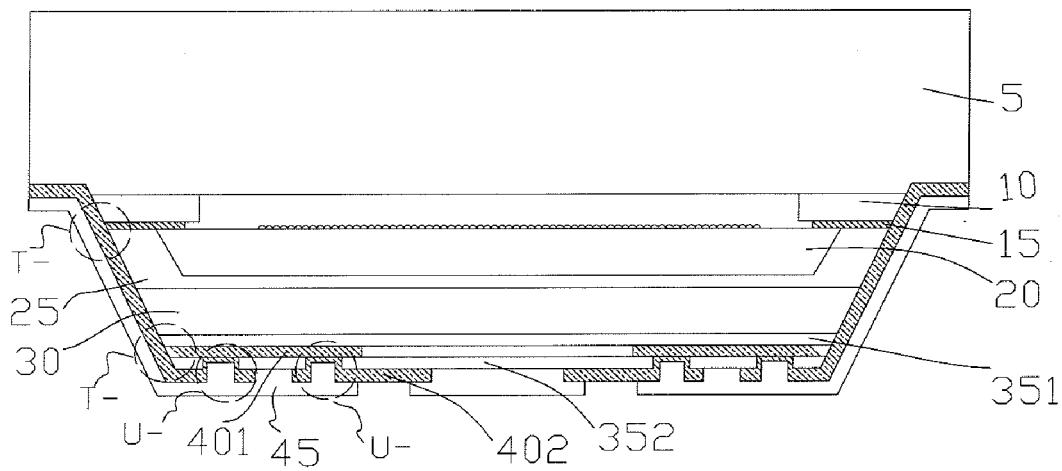
Figure 4D:
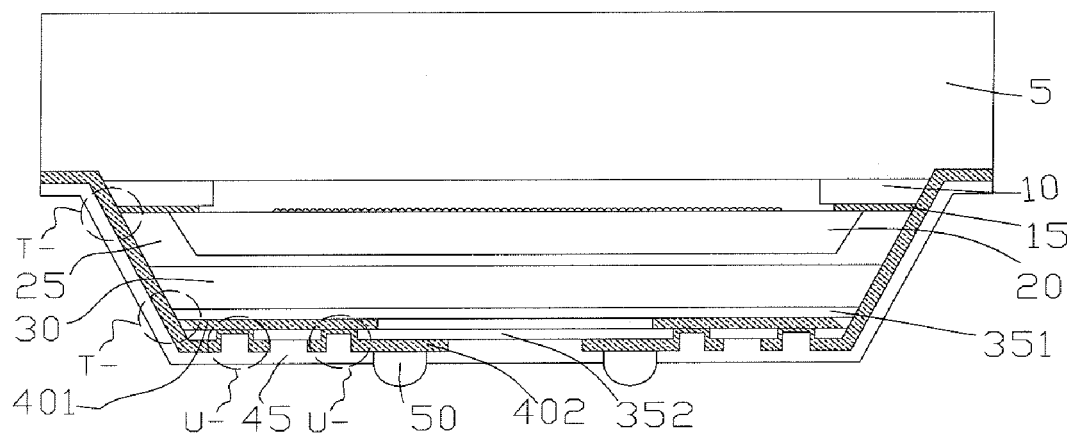

Relative to the above embodiment 1, the completely same procedures as shown in FIG. 2A-2H are performed in this embodiment. But thereafter, openings on the solder mask 352 are constructed in a different structure (FIG. 4A, 2U-shape) from the counterpart (1U-shape) shown in FIG. 2I. With the procedures as in FIG. 4B-4D being finished, the double-layer lead structure with 2T-, 2U-shape junctions are finally formed. At the bottom edge, if T-shape junction is broken, the electrical connection is possibly okay.

Embodiment 3

Figure 5:
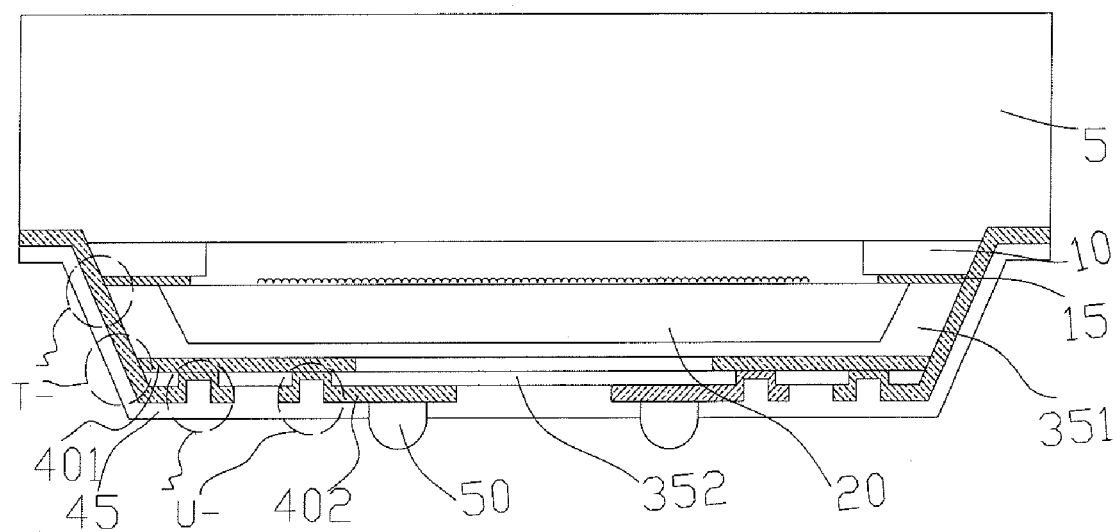
FIG. 5 is a typical cross-section of the ShellUT packaged chip device with a double-layer lead structure and 2T-, 2U-shape junctions thereof according to embodiment 3 of the present invention.

It should be noted that the present double-layer lead structure with T-, L-, U-shape and with 2T-, 2U-shape junctions is applicable to ShellUT and ShellOP. FIG. 5, as an example, shows the double-layer lead structure with 2T-, 2U-shape junctions associated with ShellUT, wherein cavities are still kept but the second glass is removed so that the associated package height is reduced. Herein relevant package processes are not detailed as they are very similar to embodiment 2.

The embodiments shown and described above are preferred and illustrative but not restrictive, and other embodiments may include the same concept, scope and spirit of the invention. Some variations or modifications in other embodiments could be clear to those skilled in the art.

What is claimed is:

1. A wafer level chip size packaged chip device with a double-layer lead structure comprising:
    a substrate having formed thereon a silicon chip, with plurality of compatible pads disposed at the periphery of said chip on said substrate;
    a first glass disposed above said chip and said substrate;
    a layer of insulating material disposed at the back of said substrate;
    a first metal layer disposed at the back of said layer of insulating material, with a through hole at the center of said first metal layer;
    a first solder mask disposed at the back of said first metal layer, with at least one opening on said first solder mask so as to enable part of said first metal layer exposed through said opening of said first solder mask;
    a second metal layer disposed at the sides of said chip device and on the back of said first solder mask;
    plurality of solder bumps each attached to a bottom end of said second metal layer so as to enable electrical connection between said compatible pads and said solder bumps via said second metal layer and said first metal layer,
    wherein, said packaged chip device has T-shape junction between said compatible pads and said second metal layer, and has L-shape and U-shape junction between said first metal layer and said second metal layer, such that, each of said compatible pads and said solder bumps are electrically connected via T-, L-, U-shape junctions.

2. A wafer level chip size packaged chip device with a double-layer lead structure comprising:
    a substrate having formed thereon a silicon chip, with plurality of compatible pads disposed at the periphery of said chip on said substrate;
    a first glass disposed above said chip and said substrate;
    a layer of insulating material disposed at the back of said substrate;
    a first metal layer disposed at the back of said layer of insulating material, with a through hole at the center of said first metal layer;
    a first solder mask disposed at the back of said first metal layer, with at least one opening on said first solder mask so as to enable part of said first metal layer exposed through said opening of said first solder mask;
    a second metal layer disposed at the sides of said chip device and on the back of said first solder mask;
    plurality of solder bumps each attached to a bottom end of said second metal layer so as to enable electrical connection between said compatible pads and said solder bumps via said second metal layer and said first metal layer,
    wherein said packaged chip device has T-shape junction between said compatible pads and said second metal layer, and has T-shape and 2U-shape junctions between said first metal layer and said second metal layer, such that, each of said compatible pads and said solder bumps are electrically connected via 2T-, 2U-shape junctions.

3. A wafer level chip size packaged chip device with a double-layer lead structure double-layer lead package structure as claimed in claim 1, wherein a cavity is formed between said substrate and said first glass so as to receive therein said chip on said substrate.

4. A wafer level chip size packaged chip device with a double-layer lead structure double-layer lead package structure as claimed in claim 1, wherein a second glass is disposed between said layer of insulating material and said first metal layer.

5. A wafer level chip size packaged chip device with a double-layer lead structure double-layer lead package structure as claimed in claim 1, wherein a third solder mask is disposed between said second glass and said first metal layer.

6. A wafer level chip size packaged chip device with a double-layer lead structure double-layer lead package structure as claimed in claim 2, wherein a cavity is formed between said substrate and said first glass so as to receive therein said chip on said substrate.

7. A wafer level chip size packaged chip device with a double-layer lead structure double-layer lead package structure as claimed in claim 2, wherein a second glass is disposed between said layer of insulating material and said first metal layer.

* * * * *